United States Patent
Kano et al.

(10) Patent No.: US 7,807,490 B2
(45) Date of Patent: Oct. 5, 2010

(54) MANUFACTURING METHOD OF NITRIDE SEMICONDUCTOR DEVICE AND NITRIDE SEMICONDUCTOR DEVICE

(75) Inventors: Takashi Kano, Hirakata (JP); Tsutomu Yamaguchi, Nara (JP); Hiroaki Izu, Hirakata (JP); Masayuki Hata, Kadoma (JP); Yasuhiko Nomura, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 12/216,928

(22) Filed: Jul. 14, 2008

(65) Prior Publication Data

US 2008/0280445 A1    Nov. 13, 2008

Related U.S. Application Data

(62) Division of application No. 11/080,398, filed on Mar. 16, 2005, now Pat. No. 7,405,096.

(30) Foreign Application Priority Data

Mar. 31, 2004    (JP) .............................. 2004-105135

(51) Int. Cl.
 *H01L 21/00* (2006.01)
(52) U.S. Cl. .................... 438/39; 438/700; 257/E21.22
(58) Field of Classification Search ............... 439/39; 257/E21.22; 438/39
See application file for complete search history.

(56) References Cited

U.S. PATENT DOCUMENTS

| 6,335,546 B1 | 1/2002 | Tsuda et al. |
| 6,566,231 B2 | 5/2003 | Ogawa et al. |
| 6,576,533 B2 | 6/2003 | Tomiya et al. |
| 6,627,552 B1 | 9/2003 | Nishio et al. |
| 7,109,049 B2 | 9/2006 | Takakura et al. |

(Continued)

FOREIGN PATENT DOCUMENTS

JP    2003-017808    1/2003

(Continued)

OTHER PUBLICATIONS

Chinese Office Action, with partial English translation, issued in Chinese Patent Application No. CN 2005100084737, mailed Dec. 7, 2007.

(Continued)

*Primary Examiner*—Kiesha R Bryant
*Assistant Examiner*—Igwe U Anya
(74) *Attorney, Agent, or Firm*—McDermott Will & Emery LLP

(57) ABSTRACT

Provided is a manufacturing method of a nitride semiconductor device having a nitride semiconductor substrate (e.g. GaN substrate) in which dislocation concentrated regions align in stripe formation, the dislocation concentrated regions extending from a front surface to a back surface of the substrate, the manufacturing method being for stacking each of a plurality of nitride semiconductor layers on the front surface of the substrate in a constant film thickness. Grooves are formed on the nitride semiconductor substrate in the immediate areas of dislocation concentrated regions. Each of the nitride semiconductor layers is formed as a crystal growth layer on the main surface of the nitride semiconductor substrate to which the grooves have been formed.

11 Claims, 18 Drawing Sheets

U.S. PATENT DOCUMENTS

| | | |
|---|---|---|
| 7,157,297 B2 | 1/2007 | Kamikawa et al. |
| 2001/0029086 A1* | 10/2001 | Ogawa et al. ............... 438/448 |
| 2002/0030200 A1 | 3/2002 | Yamaguchi et al. |
| 2002/0115267 A1* | 8/2002 | Tomiya et al. .............. 438/478 |
| 2003/0132441 A1 | 7/2003 | Takatani et al. |
| 2003/0141507 A1 | 7/2003 | Krames et al. |
| 2003/0145783 A1 | 8/2003 | Motoki et al. |
| 2003/0197166 A1* | 10/2003 | Ishida et al. .................. 257/1 |
| 2004/0089919 A1* | 5/2004 | Motoki et al. ............... 257/613 |
| 2004/0245540 A1 | 12/2004 | Hata et al. |
| 2005/0025204 A1 | 2/2005 | Kamikawa et al. |
| 2005/0025205 A1 | 2/2005 | Ryowa et al. |
| 2005/0042787 A1 | 2/2005 | Ito et al. |
| 2005/0139857 A1 | 6/2005 | Shin |
| 2005/0141577 A1* | 6/2005 | Ueta et al. .................... 372/43 |
| 2005/0151153 A1* | 7/2005 | Kamikawa et al. .......... 257/103 |
| 2005/0221515 A1* | 10/2005 | Yanashima et al. ............ 438/21 |
| 2006/0038166 A1 | 2/2006 | Tsuda et al. |
| 2007/0051961 A1* | 3/2007 | Kamikawa et al. ............ 257/94 |

FOREIGN PATENT DOCUMENTS

| | | |
|---|---|---|
| JP | 2003-124573 A | 4/2003 |
| JP | 2003-179311 | 6/2003 |
| JP | 2004-000328 | 1/2004 |
| JP | 2004-356454 A | 12/2004 |
| JP | 2005-236109 | 9/2005 |
| WO | WO 03/038957 A1 | 5/2003 |

OTHER PUBLICATIONS

Japanese Office Action, with English translation and Verification of English translation, issued in Japanese Patent Application No. 2006-078726, mailed Feb. 23, 2010.

Japanese Office Action, with English translation and Verification of English translation, issued in Japanese Patent Application No. 2004-105135, mailed Feb. 23, 2010.

\* cited by examiner

FIG.17

| | DIFFERENCE BETWEEN LARGEST FILM-THICKNESS AND SMALLEST FILM-THICKNESS Δt | RATIO BETWEEN (DIFFERENCE BETWEEN LARGEST FILM-THICKNESS AND SMALLEST FILM-THICKNESS) AND (AVERAGE FILM THICKNESS FOR THE WHOLE LAYER STRUCTURE) Δt/tave |
|---|---|---|
| IN CONVENTIONAL EXAMPLE | 0.8~1.0 μm | 27~33% |
| IN GROOVE PATTERN OF FIG.5 | 0~0.25 μm | 0~8.3% |
| IN GROOVE PATTERN OF FIG.11 | 0 μm (MEASURELESSLY FLAT) | 0% |

MANUFACTURING METHOD OF NITRIDE SEMICONDUCTOR DEVICE AND NITRIDE SEMICONDUCTOR DEVICE

RELATED APPLICATIONS

This application is a Divisional of U.S. application Ser. No. 11/080,398, filed Mar. 16, 2005 now U.S. Pat. No. 7,405,096, claiming priority of Japanese Application Nos. 2004-105135, filed Mar. 31, 2004, the entire contents of each of which are hereby incorporated by reference.

BACKGROUND OF THE INVENTION (1) Field of the Invention

The present invention relates to a manufacturing method of a nitride semiconductor device and to a nitride semiconductor device.

(2) Related Art

Recently, many efforts are put into development relating to nitride semiconductor devices which are usable as a light source of next-generation optical disks of large capacity. One example is shown in International publication No. WO 03/038957A1.

A nitride semiconductor device is manufactured by subjecting each of nitride semiconductor layers to crystal growth on a nitride semiconductor substrate, using a MOCVD (metalorganic chemical vapor deposition) method.

FIG. 1 is a perspective diagram schematically showing one example of such a nitride semiconductor substrate.

A nitride semiconductor substrate 1701 is made of: dislocation concentrated regions 1704, 1705, 1706, and 1707 which have concentrated therein defect crystals and align as stripes that pass through the nitride semiconductor substrate 1701 from a front surface 1702 to a back surface 1703; and low dislocation regions 1708, 1709, and 1710 which are normally crystallized regions. The width of each of the low dislocation regions 1708, 1709, and 1710 (i.e. the distance between each adjacent dislocation concentrated regions) is about 400 µm, for example.

On the front surface 1702 of the nitride semiconductor substrate 1701, semiconductor crystal growth is conducted using the MOCVD method for example, thereby obtaining a nitride-semiconductor layer structure.

FIG. 2 is a schematic diagram showing a layer structure of a conventional nitride semiconductor generated as in the above way, which is cut in a direction orthogonal to a direction in which the dislocation concentrated regions extend. On the front surface 1702 of the nitride semiconductor substrate 1701, crystal growth layers 1801, 1802, and 1803 are formed. The film thickness of the crystal growth layers 1801, 1802, and 1803 is not constant. In other words, the crystal growth layers 1801, 1802, and 1803 are thick in end portions 1804 and 1805, which are in the vicinity of the dislocation concentrated regions 1704 and 1705 respectively, compared to a center portion 1806.

So as to produce a nitride semiconductor laser device from a nitride semiconductor having such crystal growth layers 1801, 1802, and 1803, provision of waveguides in stripe-formation becomes necessary so as to obtain a light trapping structure. There are various methods for forming such waveguides. Among such methods, ridge-type waveguides are formed using an etching technology by which depth and width are precisely controlled to an accuracy of about $\frac{1}{100}$ µm.

However, if crystal growth layers have inconsistent film thickness, etching in the waveguide forming process will be uneven, and so a resulting nitride semiconductor laser device will have problems such as characteristic deterioration and yield reduction.

SUMMARY OF THE INVENTION

In view of the above, the object of the present invention is to provide a nitride semiconductor device having nitride semiconductor layers, as crystal growth layers that each have constant film thickness, on a main surface of a nitride semiconductor substrate in areas except for dislocation concentrated regions, and a manufacturing method of such a nitride semiconductor device.

The stated object is achieved by a manufacturing method of a nitride semiconductor device having a nitride semiconductor substrate in which dislocation concentrated regions align in stripe formation, the dislocation concentrated regions extending from a front surface to a back surface of the substrate, the manufacturing method having: a stacking step of forming nitride semiconductor layers on the front surface of the substrate in areas except for the dislocation concentrated regions; and a groove-forming step of, prior to the stacking step, performing groove-forming to at least immediate areas of the dislocation concentrated regions on the front surface.

With the stated method, consistency of film thickness is maintained for the nitride semiconductor layers formed in the stacking step, which contributes to device characteristic enhancement and product yield improvement.

In addition, the groove-forming step has a mask-forming substep of forming etching masks on the front surface of the substrate excluding the dislocation concentration regions as well as the immediate areas; an etching substep of subjecting the front surface of the substrate to etching; and a mask-removal substep of removing the etching masks formed in the mask-forming substep.

With the stated method, it becomes possible to form each groove to include a pair of immediate areas and a corresponding dislocation concentrated region.

In addition, the etching masks are made of SiO2, and the etching substep is conducted by a reactive ion etching that uses Cl2 gas.

With the stated method, the grooves are assuredly formed.

In addition, a width and a depth of each resulting groove are within such ranges that restrain migration of the nitride semiconductor layers from inside to outside of the groove in the succeeding stacking step.

With the stated method, a nitride semiconductor absorbent to be stacked is restrained from migration, thereby maintaining consistency in the film thickness.

In addition, the groove-forming step is performed using anisotropic etching, so that each resulting groove has a substantially rectangular sectional form.

With the stated method, it becomes easy to form grooves to include the dislocation concentrated regions.

In addition, a sectional form of each resulting groove is formed as a mesa whose both side walls are inclined towards a corresponding dislocation region from the front surface of the substrate to a bottom wall of the groove.

With the stated method, edge effect is reduced thereby further enhancing the consistency in film thickness.

In addition, a sectional form of each resulting groove is formed as a reverse mesa whose both side walls are inclined towards an opposite direction to a corresponding dislocation region from the front surface of the substrate to a bottom wall of the groove.

With the stated method, the absorbent migration is further restrained.

In addition, the manufacturing method further has: an orthogonal-groove forming step of, in parallel with the groove-forming step, forming grooves orthogonal to grooves resulting from the groove-forming step, on the front surface of the substrate in areas except for the dislocation concentrated regions.

With the stated method, the resulting two-directional groove pattern further enhances the consistency in film thickness to perfection, and also facilitates easy separation of nitride semiconductor devices.

In addition, the front surface and the back surface of the substrate are (0001) crystal planes.

With the stated method, separation of the nitride semiconductor devices becomes easy by cleaving.

The stated object is also achieved by a nitride semiconductor device where at least one of ends of a low dislocation region of a nitride semiconductor substrate is provided with a stepping part whose lowest level has an extension of a dislocation concentrated region as a stripe, and nitride semiconductor layers are formed on a surface of the low dislocation region.

The stated structure enables constant film thickness for each nitride semiconductor layer constituting a nitride semiconductor device, and so enables manufacturing of a nitride semiconductor device having an excellent semiconductor characteristic as well as a desirable product yield.

BRIEF DESCRIPTION OF THE DRAWINGS

These and other objects, advantages and features of the invention will become apparent from the following description thereof taken in conjunction with the accompanying drawings that illustrate a specific embodiment of the invention. In the drawings:

FIG. 17 is a diagram showing an example of comparing film thickness consistency between the embodiments of the present invention and the conventional example.

DESCRIPTION OF THE PREFERRED EMBODIMENTS

As follows, a nitride semiconductor device according to the present invention and a manufacturing method thereof are described as embodiments with use of the drawings.

First Embodiment

Figure 1:
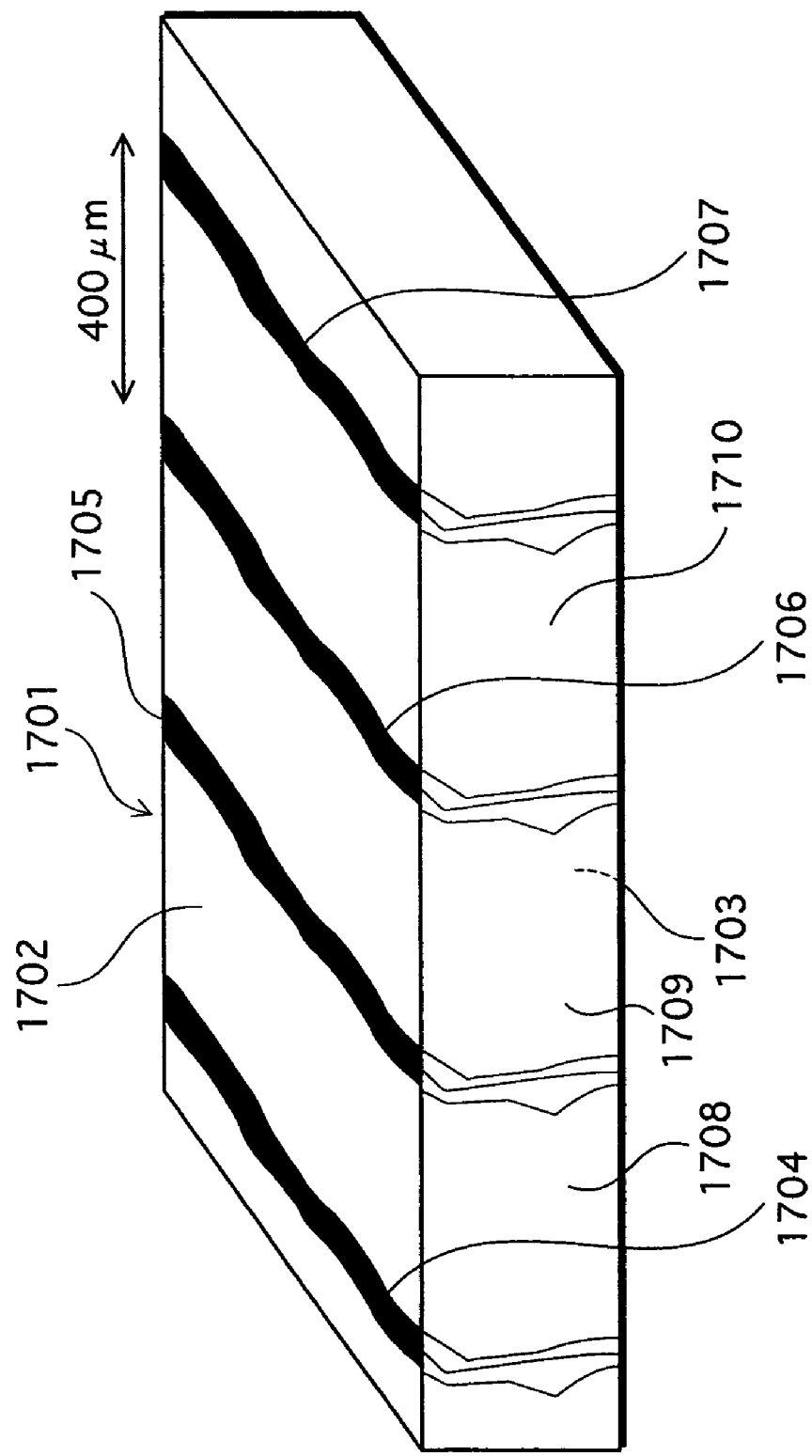
FIG. 1 is a perspective diagram schematically showing a nitride semiconductor substrate having dislocation concentrated regions in stripe formation.
Figure 2:
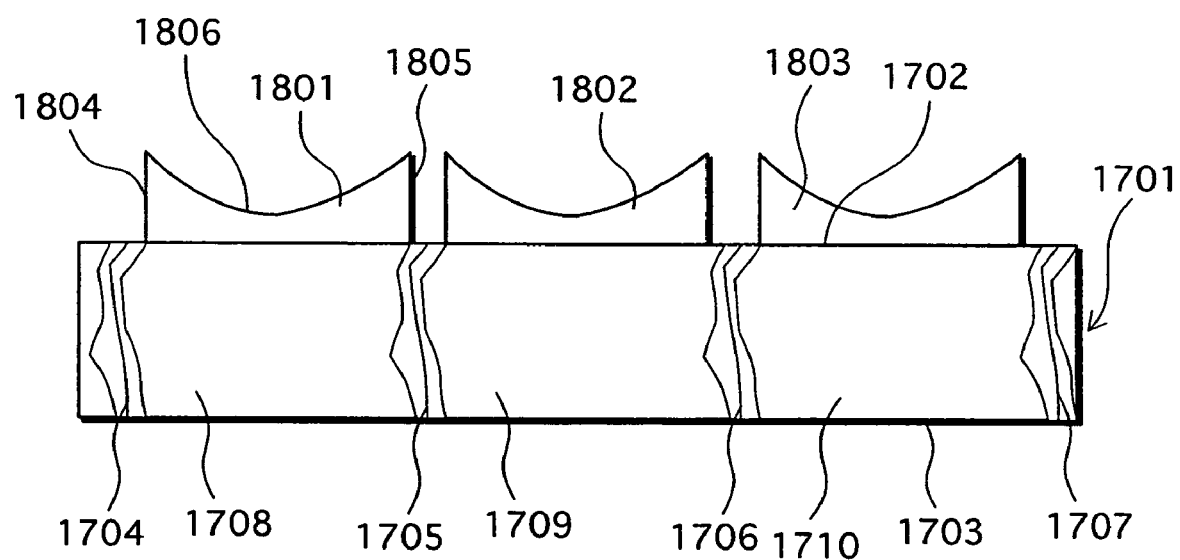
FIG. 2 is a schematic diagram drawn to explain a layer structure of a conventional nitride semiconductor.
Figure 3:
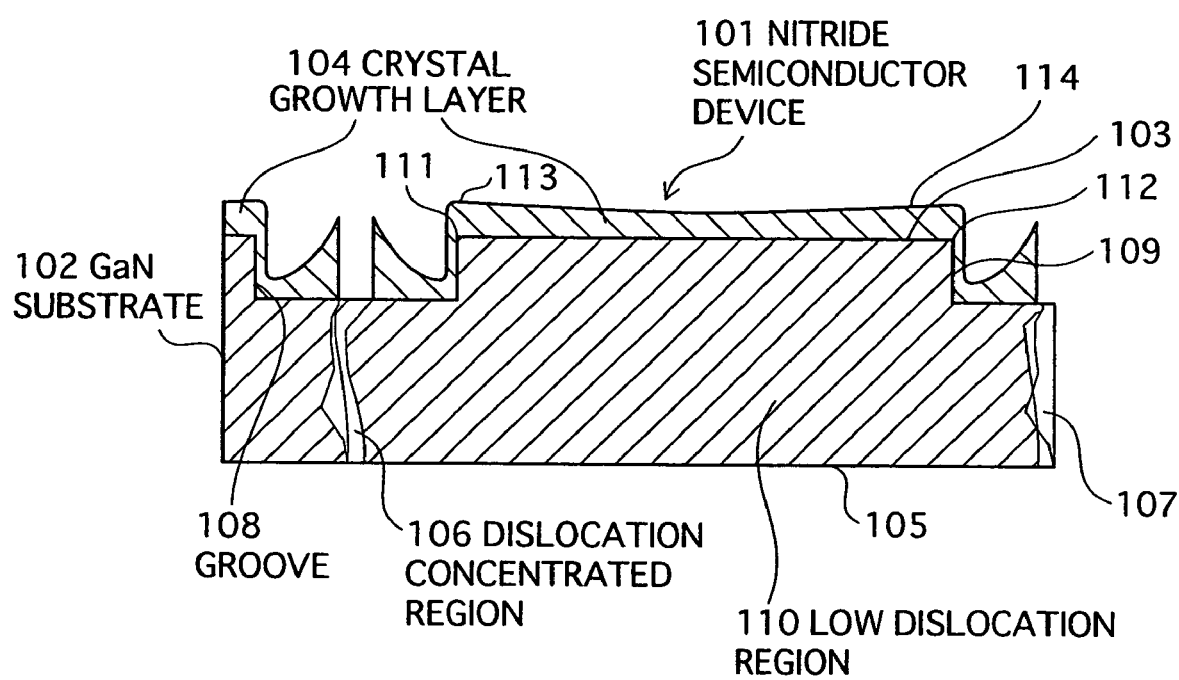
FIG. 3 is a sectional diagram drawn to explain film thickness of a crystal growth layer formed on a GaN substrate, in a nitride semiconductor device according to the first embodiment of the present invention.

FIG. 3 is a sectional diagram drawn to explain film thickness of a layer structure formed on a GaN substrate in a nitride semiconductor device according to the first embodiment of the present invention.

In a nitride semiconductor device 101, a layer structure, which is made of a crystal growth layer 104 of a nitride semiconductor, is formed on a front surface 103 of a GaN substrate 102.

In the GaN substrate 102, dislocation concentrated regions 106 and 107 are formed. The dislocation concentrated regions 106 and 107 have concentrated therein defect crystals and align as stripes that pass through the GaN substrate 102 from the front surface 103 to a back surface 105. Moreover, grooves 108 and 109 are formed along a direction in which the dislocation concentrated regions 106 and 107 extend.

Then, crystal growth materials including group-III element and N element (e.g. Ga, Al, In) are supplied, using the MOCVD method, to the front surface 103 of the GaN substrate 102 on which the grooves 108 and 109 are formed, thereby completing the crystal growth layer 104.

Note that an adsorbent of group-III element and N element hardly adheres to the surface of the dislocation concentrated regions 106 and 107. The portion of the adsorbent that is to be adhered to the dislocation concentrated regions 106 and 107 will stack on the grooves 108 and 109 provided to the GaN substrate 102. In addition, the grooves 108 and 109 are formed to have a depth d with respect to the front surface 103. Therefore, the absorbent stacked in part of a low dislocation region 110 within the grooves 108 and 109 is restrained from migrating from inside to outside of the grooves 108 and 109.

This will help improve constancy of the film thickness of the crystal growth film 104 formed on the front surface 103 of the GaN substrate 102 (in areas corresponding to the low dislocation region 110).

Note that since the grooves 108 and 109 are formed by etching, edges will be formed at respective boundaries between the grooves 108, 109 and the front surface 103. The edges tend to absorb the absorbent ("edge effect"), and so the crystal growth layer 104 will have parts having a slightly upward slope (slope parts 113 and 114), which positionally correspond to edges 111 and 112.

The following explains a process for forming grooves for the nitride semiconductor substrate according to the present embodiment.

Figure 4A:
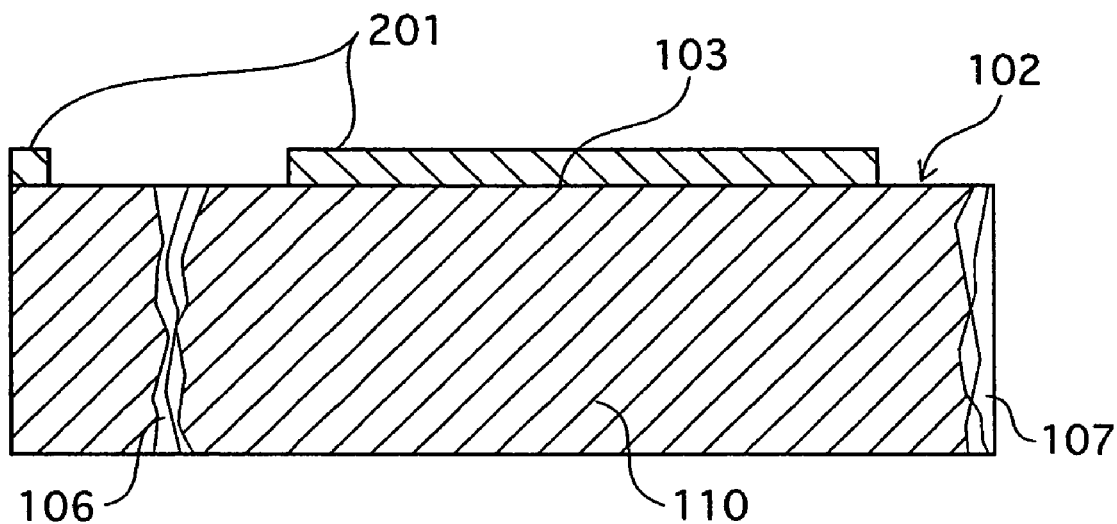
FIG. 4A and FIG. 4B are sectional diagrams drawn to explain groove-forming process according to the first embodiment.

As FIG. 4A shows, on the front surface 103 which is made out of a (0001) crystal plane of the GaN substrate 102, $SiO_2$ layers are formed as masks 201 using a PCVD method (plasma chemical vapor deposition). More specifically, the $SiO_2$ layers are formed on the low dislocation region 110 in areas except for each immediate area of the dislocation concentrated regions 106 and 107 that aligns in the direction orthogonal to the paper on which FIG. 4A is drawn. Note that the material for the masks 201 may alternatively be an insulating material such as Ni (Nickel), photoresist, $Al_2O_3$, and SiN. The thickness of each mask 201 is set as 0.36 μm, for example.

Next, using an RIE (reactive ion etching) method, selective etching is performed for the GaN substrate 102 excluding areas having the masks 201 thereon. The etching is performed using a $Cl_2$ gas whose gas pressure is 25 mTorr, flow rate of 25 sccm, plasma excitation power of 200 W, and etch rate of 0.135 μm/min, for example. Under the above-stated condition, grooves having a depth d=1 μm from the front surface 103 of the GaN substrate 102 are created. Note that the etching may be alternatively performed using a gas that contains chlorine (e.g. $BCl_3$).

After this etching process, masks 201 made of $SiO_2$ are removed.

Figure 4B:
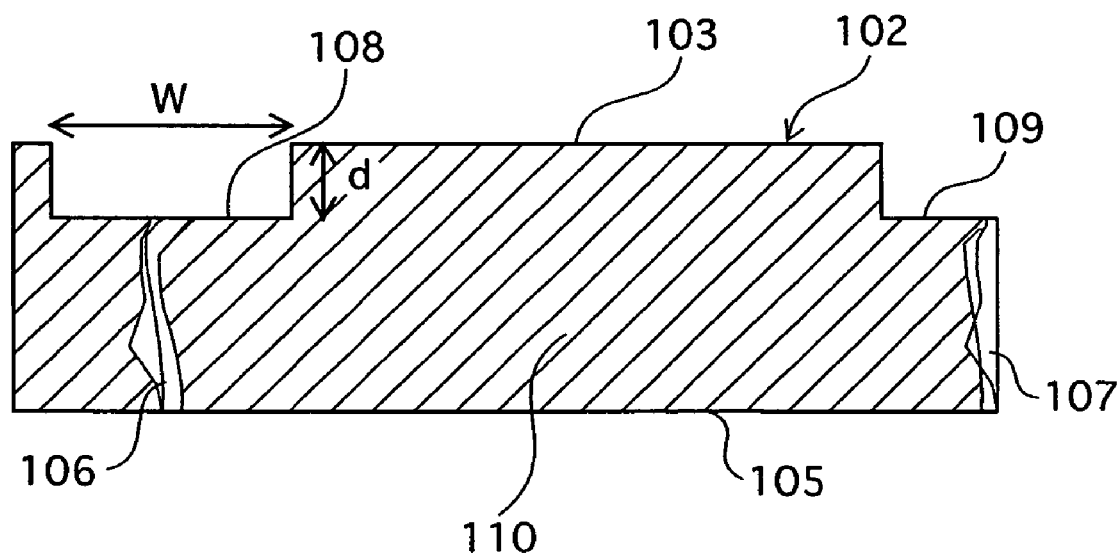

FIG. 4B is a sectional view of the GaN substrate 102 having undergone the groove-forming process. On the front surface 103 of the GaN substrate 102, grooves 108 and 109, having a depth d=1 μm, a width w=100 μm, are created.

Figure 5:
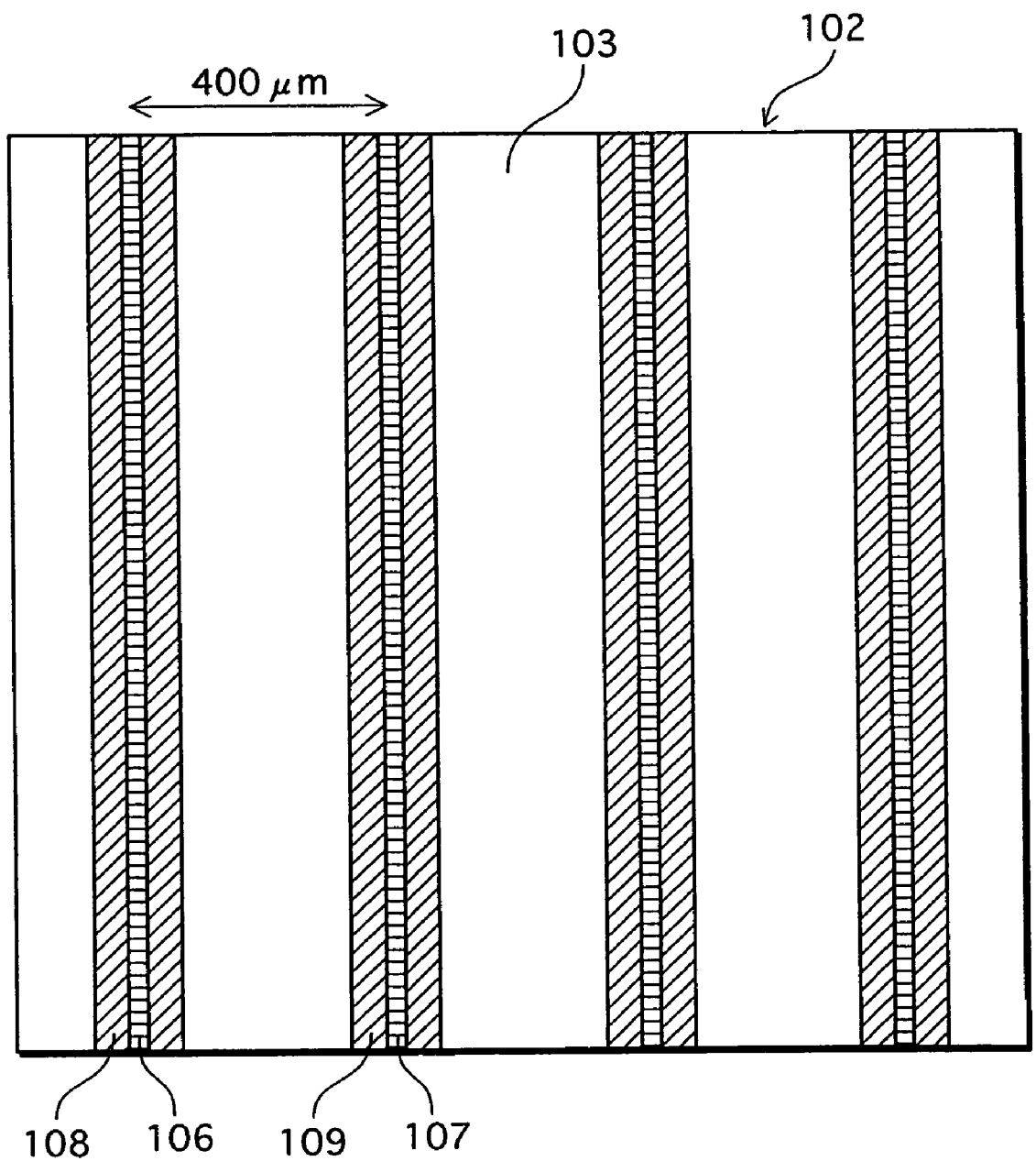
FIG. 5 is a diagram showing a groove pattern according to the first embodiment, seen from above.

FIG. 5 schematically illustrates the GaN substrate 102 of FIG. 4B, seen from above. As shown in this drawing, on the front surface 103 of the GaN substrate 102, the grooves 108 and 109 are formed along the dislocation concentrated regions 106 and 107 aligning in stripe formation. The distance of these grooves 108 and 109, from center to center, is 400 μm, for example.

The following explains a process of stacking nitride semiconductor laser devices, being nitride semiconductor devices, onto the GaN substrate 102 having undergone the groove-forming process. Note that for simplifying the explanation, the following only explains a case where the GaN substrate 102 is of n-type conductivity, and the diagram used only shows between the grooves 108 and 109 from center to center.

Figure 6:
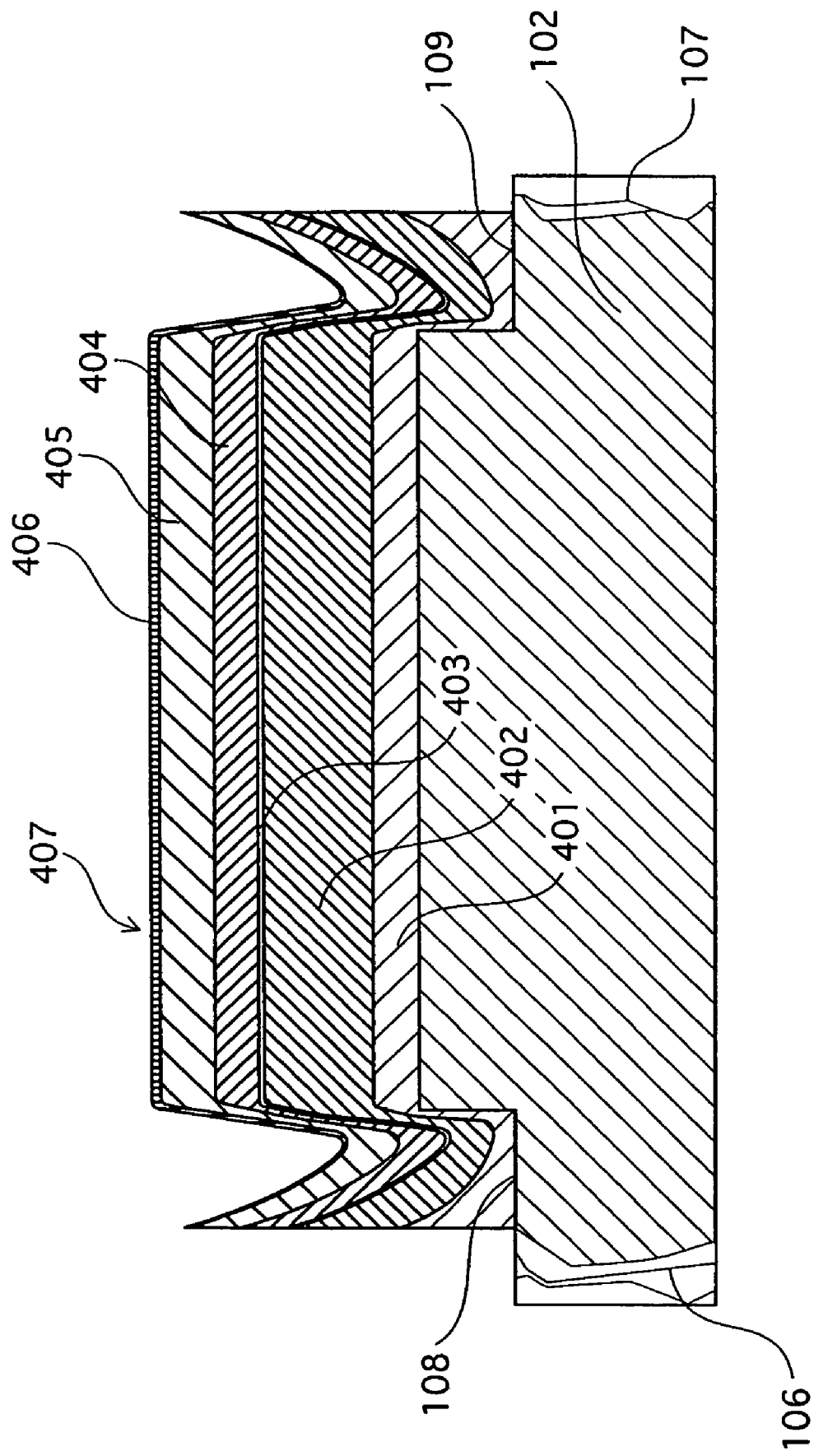
FIG. 6 is a first sectional diagram for explaining a process of manufacturing a nitride semiconductor laser device according to the first embodiment.

FIG. 6 is a sectional diagram for explaining the stacking process. The following stacking process is performed using the MOCVD method.

(1) A buffer layer 401 is formed on the GaN substrate 102 of n-type conductivity, as in the following way. The GaN substrate 102 is placed in a hydrogen/nitride atmospheric reactor, and heated to about 1000° C. while supplying $NH_3$ gas being a nitride material for a nitride semiconductor layer. When the temperature of the GaN substrate 102 has become about 1000° C., a hydrogen gas, which contains TMGa (trimethylgallium) being a Ga material, and TMAl (trimethylaluminum) being an Al material, is supplied within the reactor, thereby forming an undoped $Al_{0.01}Ga_{0.99}N$ layer on the GaN substrate 102, as a buffer layer 401. This buffer layer 401 has thickness of 1.0 μm for example, and functions as a buffer between the GaN substrate 102 and a nitride semiconductor laser structure that is formed over the buffer layer 401.

(2) An n-type clad layer 402 is formed on the buffer layer 401, as in the following way. A hydrogen gas, which contains TMGa, TMAl, and $GeH_4$ (monogermane) being a Ge impurity material, is supplied in the reactor, thereby forming the n-type clad layer 402 made of Ge-doped $Al_{0.07}Ga_{0.93}N$ with a thickness of about 1.5 μm.

(3) An n-side carrier block layer 403 is formed on the n-type clad layer 402, as in the following way. A hydrogen gas, which contains TMGa and TMAl, is supplied in the reactor, thereby forming the n-side carrier block layer 403 made of $Al_{0.02}Ga_{0.8}N$ with a thickness of about 20 nm.

(4) A light emitting layer 404 is formed on the n-side carrier block layer 403, as in the following way. The temperature of the GaN substrate 102 is reduced to about 800° C. Then TEGa (triethylgallium) which is a Ga material and TMIn (trimethylindium) which is an In material are supplied in a nitrogen-atmospheric reactor to which $NH_3$ gas has been supplied, thereby forming an MQW active layer having a multiple quantum well structure (MQW). The MQW active layer is made by alternately stacking three quantum well layers each made of undoped $In_xGa_{1-x}N$ with a thickness of about 3.5 nm, and three quantum barrier layers each made of undoped $In_yGa_{1-y}N$ with a thickness of about 20 nm.

Here, x>y (x=0.15 and y=0.03).

TEGa and TMIn are also supplied on the upper surface of the MQW active layer, so as to form a p-side optical guide layer made of undoped $In_{0.01}Ga_{0.99}N$ with a film thickness of about 0.1 μm.

TMGa (Ga material) and TMAl (AL material) are supplied on the upper surface of the p-side optical guide layer in the reactor, so as to form a p-side carrier block layer made of $Al_{0.25}Ga_{0.75}N$ with a thickness of about 20 nm.

The light emitting layer 404 is constituted by the above-described MQW active layer, the p-side optical guide layer, and the p-side carrier block layer.

(5) A p-type clad layer 405 is formed on the light emitting layer 404, as in the following way.

The GaN substrate 102 is heated again to about 1000° C. Then $Mg(C_5H_5)$ (cyclopentadienylmagnesium), which is a Mg material and is a p-type impurity, TMGa, and TMAl are supplied to the reactor of hydrogen/nitrogen atmosphere to which $NH_3$ gas is supplied, thereby forming the p-type clad layer 405 made of Mg-doped $Al_{0.07}Ga_{0.93}N$ with a film thickness of about 0.5 μm.

(6) A p-side contact layer 406 is formed on the p-type clad layer 405, as in the following way.

The temperature of the GaN substrate 102 is reduced to about 800° C. again, and TEGa (Ga material) and TMIn (In material) are supplied in a nitrogen-atmospheric reactor to which $NH_3$ gas has been supplied, thereby forming the p-side contact layer 406 made of undoped $In_{0.07}Ga_{0.93}N$ with a thickness of about 2 nm.

After the above-described steps, the process for stacking nitride semiconductor laser devices on GaN substrate 102 end. Then a resulting substrate 407 is cooled to about room temperature, and taken out from the reactor.

Next, waveguides are provided for the substrate 407 to which the layer structure of the nitride semiconductor laser devices is formed, as in the following way.

Figure 7:
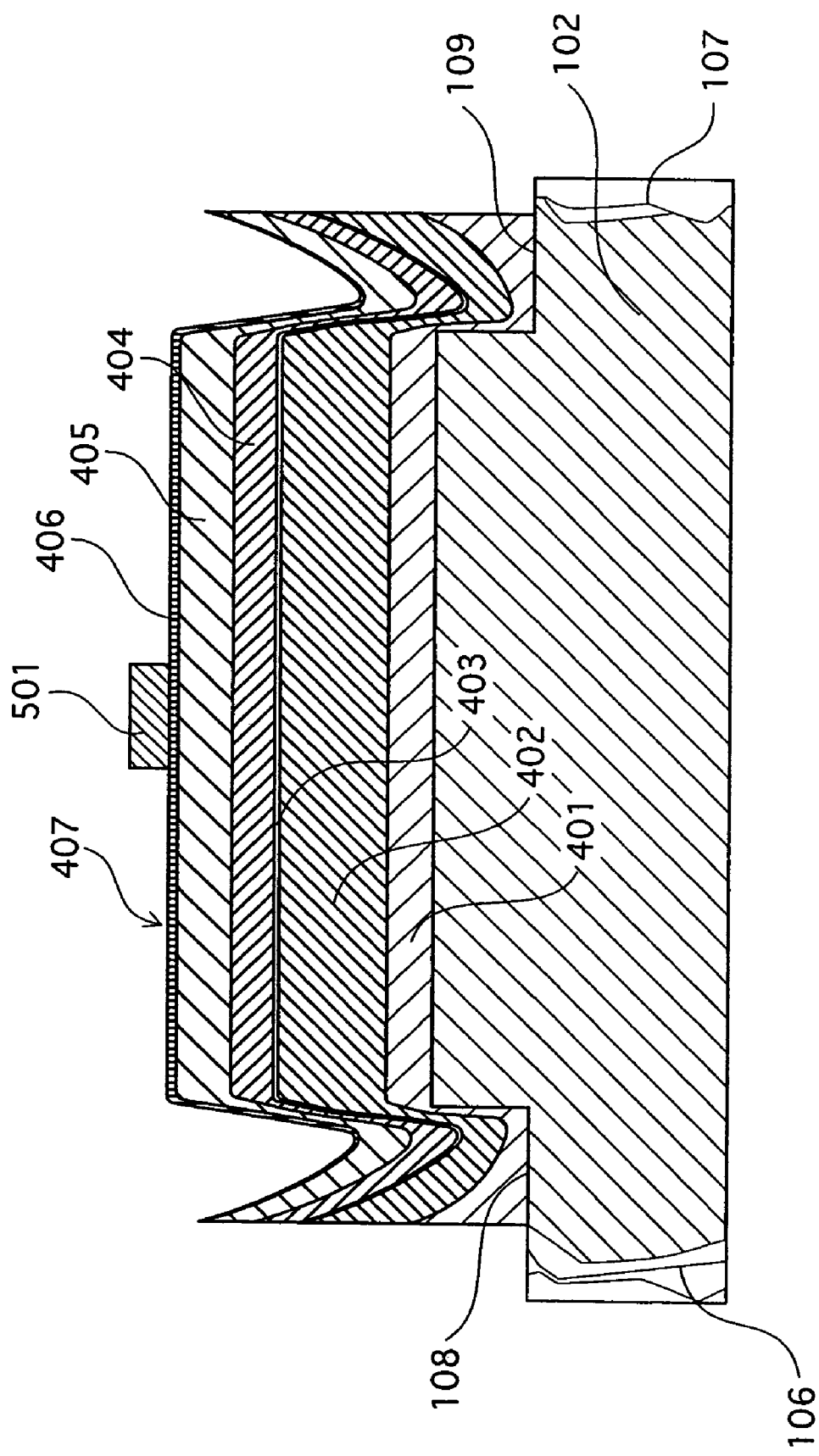
FIG. 7 is a second sectional diagram for explaining the process of manufacturing the nitride semiconductor laser device according to the first embodiment.

The waveguide forming process includes: forming, onto the substantial center of the p-side contact layer 406 of the substrate, a mask 501 being made of a $SiO_2$ layer formed as a swath having about 1.5 μm width, in a direction substantially parallel to the direction in which the dislocation concentrated regions 106 and 107 run (FIG. 7); and ridge-forming etching in an RIE method that uses $Cl_2$ gas.

Figure 8:
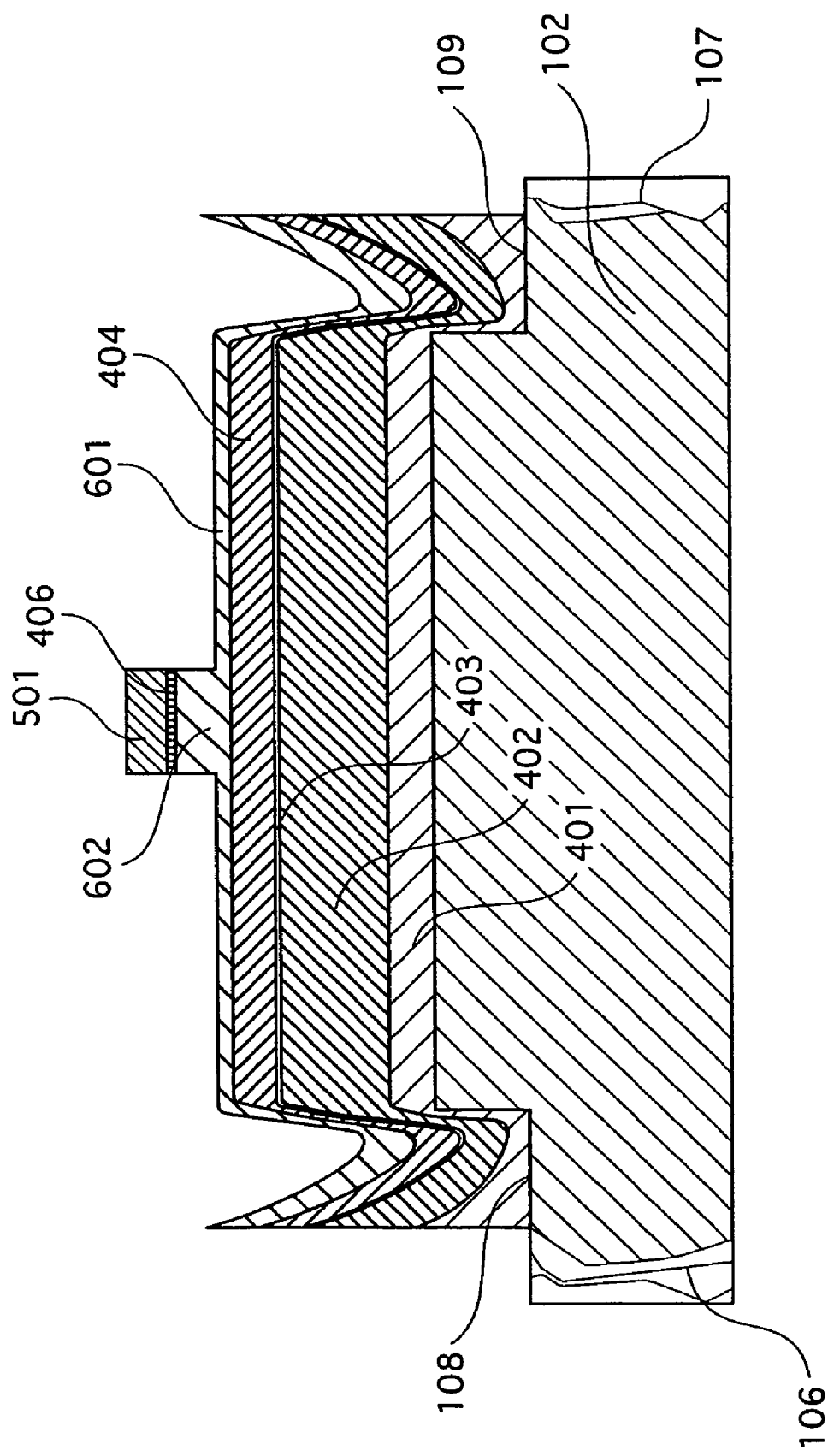
FIG. 8 is a third sectional diagram for explaining the process of manufacturing the nitride semiconductor laser device according to the first embodiment.

As FIG. 8 shows, the ridge-forming etching removes: all the p-side contact layer 406 except for a region to which the mask is formed; and about 90% of the film thickness of the p-type clad layer 405 also except for a region over which the mask is formed. As a result of this process, the p-type clad layer 601 will be provided with a protruding part 602 with a film thickness of about 0.45 μm.

Figure 9:
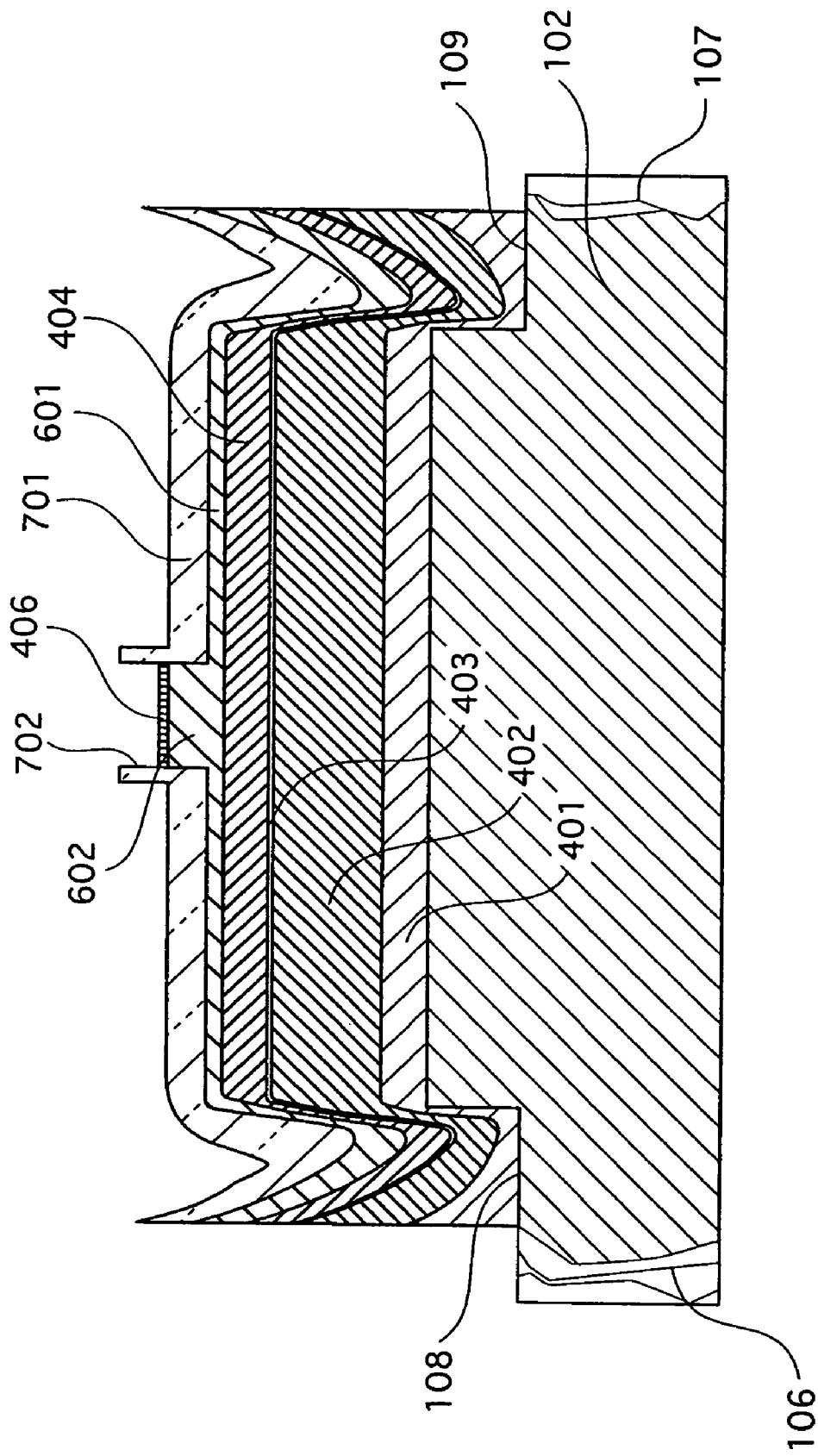
FIG. 9 is a fourth sectional diagram for explaining the process of manufacturing the nitride semiconductor laser device according to the first embodiment.

Next, as FIG. 9 shows, electric-current block layers 701, each of which is made of a $SiO_2$ layer, are formed to cover the flat areas of the p-type clad layer 601 and the side surfaces of the protruding part 602. Then the mask 501 is removed. The electric-current block layers 701 are formed to have a film thickness of about 0.2 μm. An area from which the mask is removed will be a swath-form groove 702.

Figure 10:
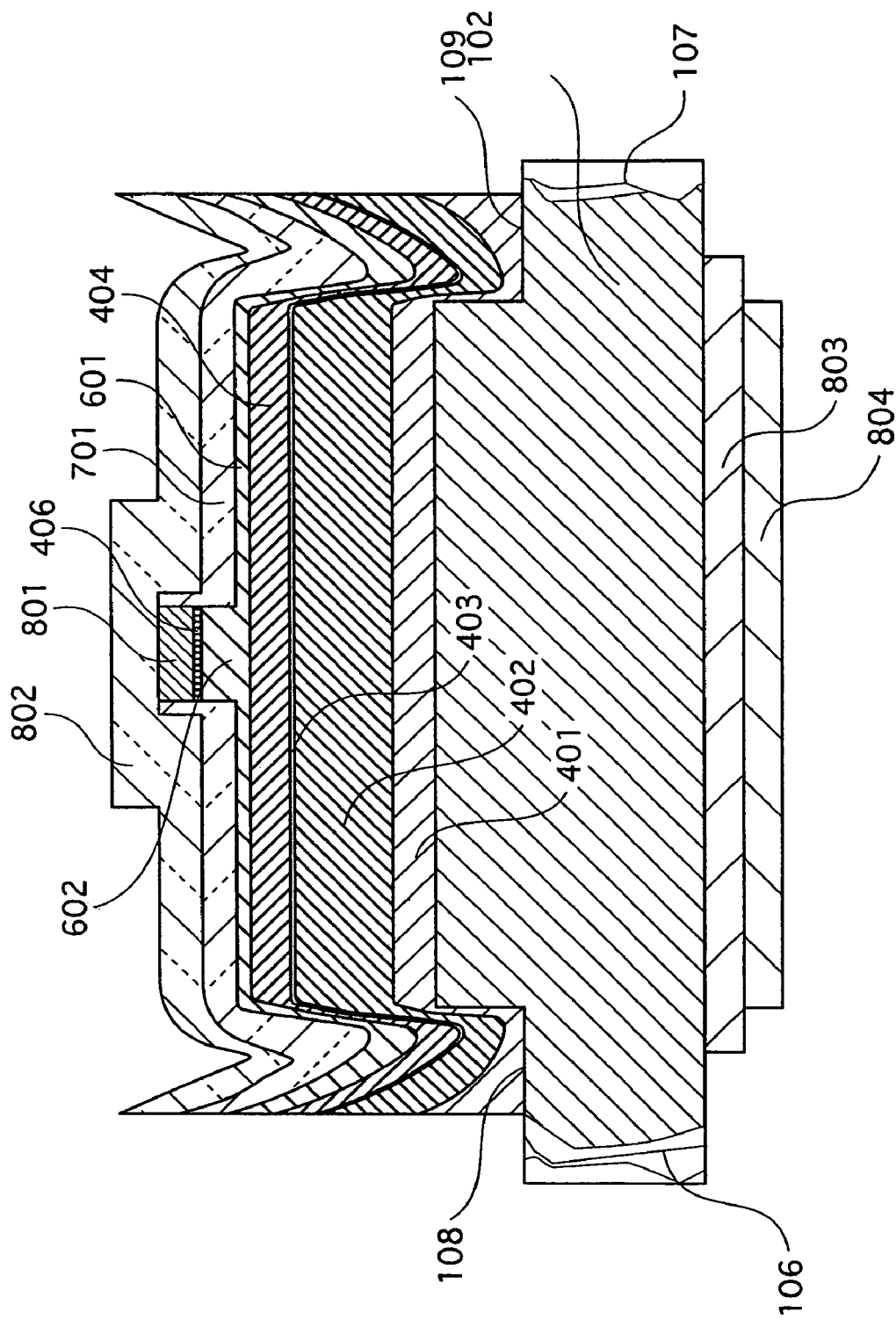
FIG. 10 is a sectional diagram of the nitride semiconductor laser device according to the first embodiment.

As FIG. 10 shows, within the swath-form groove 702 resulting after removing the mask 501, a p-side ohmic electrode 801 is formed on the p-side contact layer 406. Then a p-side pat electrode 802 is formed to cover the whole upper surface.

The back surface of the GaN substrate 102, after being ground to be cleavable, is provided with an n-side ohmic electrode 803 and an n-side pad electrode 804, thereby completing a nitride semiconductor laser device.

According to the manufacturing method stated above, a film thickness of the nitride semiconductor laser device is maintained substantially constant during the stacking process. This prevents defective pieces to be generated even in such a process as the waveguide forming process which requires accuracy. This contributes improvement in product yields.

Note that in the manufacturing method of nitride semiconductor laser device explained in the above-described embodiment, only one ridge is formed between the groove 108 and the groove 109. However, the present invention is not limited to such a structure, and two or more ridges may be provided between each adjacent grooves.

In addition, in the above-described embodiment, the groove 108 (and the like) is provided to run along the dislocation concentrated region 106 (and the like). However, the present invention is not limited to such, and other groove patterns are also possible, including an example shown in FIG. 11.

Figure 11:
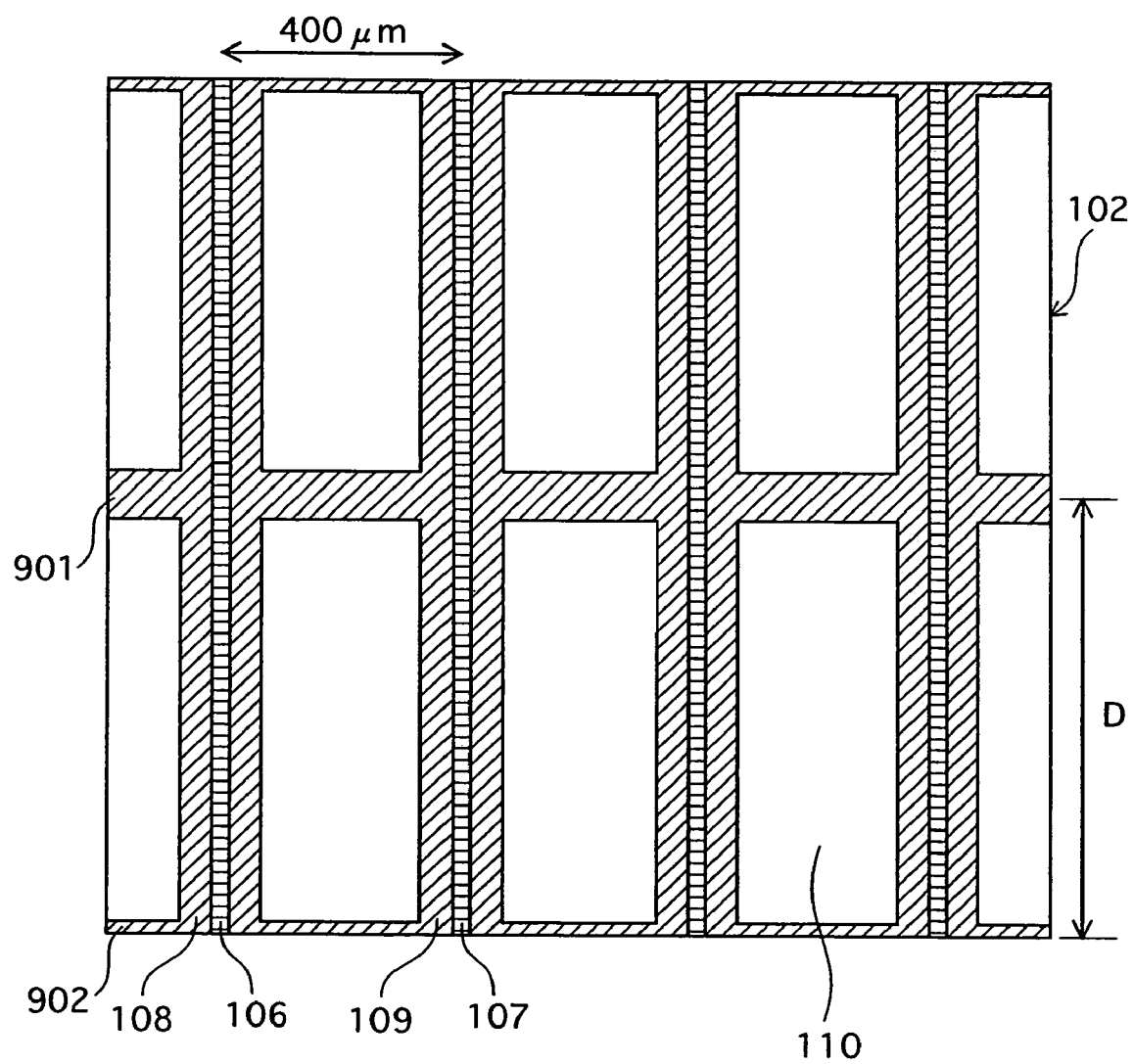
FIG. 11 is a diagram drawn to show a groove pattern according to a modification example of the nitride semiconductor device of the present invention.

FIG. 11 is a diagram of the upper main surface of the GaN substrate 102. As this diagram shows, the front surface 103 corresponding to the low dislocation region 110 may be provided with orthogonal grooves 901, 902, and so on, which are orthogonal to the grooves 108 and 109. A distance D between the orthogonal grooves 901 and 902 is desirably set so that a value, which is obtained by subtracting the groove width of the orthogonal groove 901 (902) from the distance D, corresponds to an optical path length of a nitride semiconductor laser device, or corresponds to a value obtained by an integer number times the optical path length. By doing so, it becomes easy to separate nitride semiconductor laser devices with respect to such orthogonal grooves.

In addition, in the above-described embodiment, the groove 108 (and the like) has a rectangular sectional form, due to use of anisotropic etching. However, the sectional form may be different, including the following examples.

Figure 12:
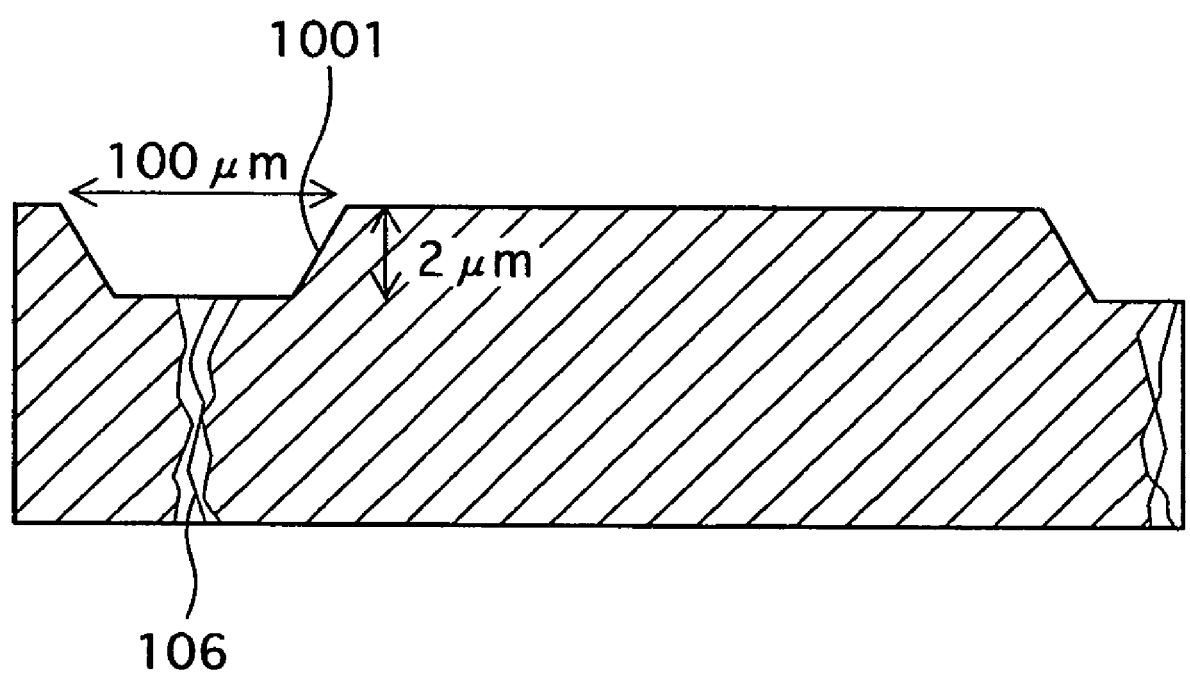
FIG. 12 is a sectional view of a groove according to a modification example (No. 1)

In FIG. 12, a groove section 1001 is set in a mesa form. According to such sectional form, edge effect is reduced. In this example, a groove depth is set as 2 μm.

Figure 13:
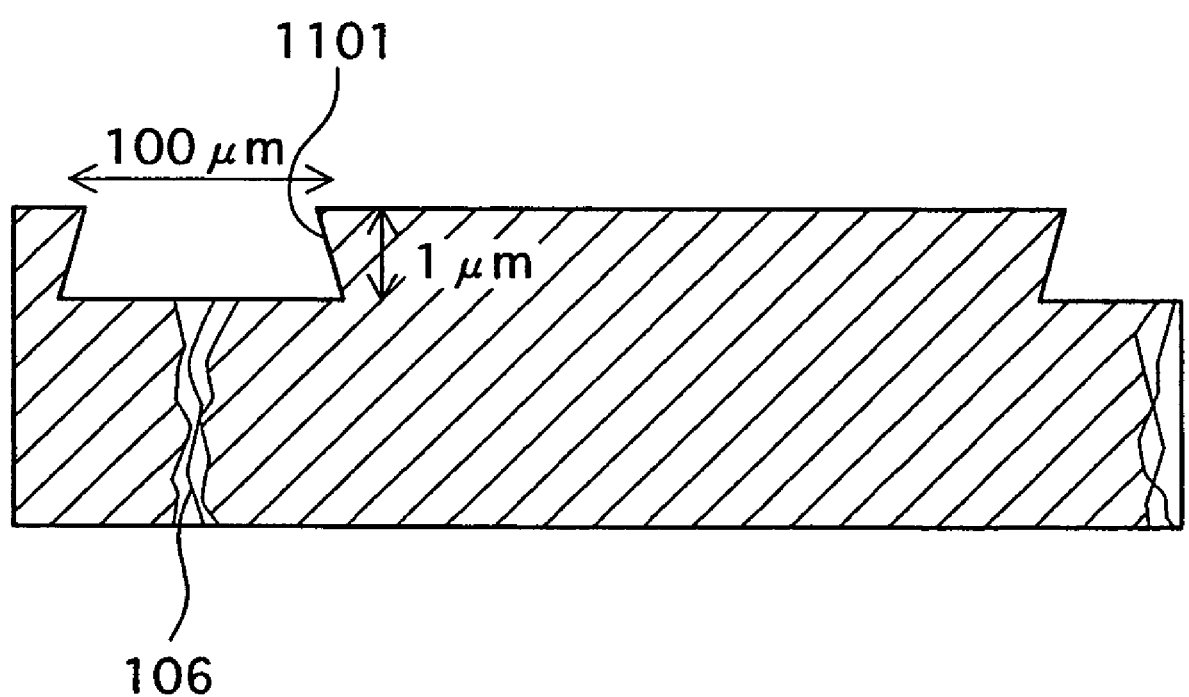
FIG. 13 is a sectional view of a groove according to a modification example (No. 2)

In FIG. 13, a groove section 1101 is set in a reverse-mesa form. According to such sectional form, it is possible to further reduce adsorbent migration from inside to outside of grooves.

Figure 14:
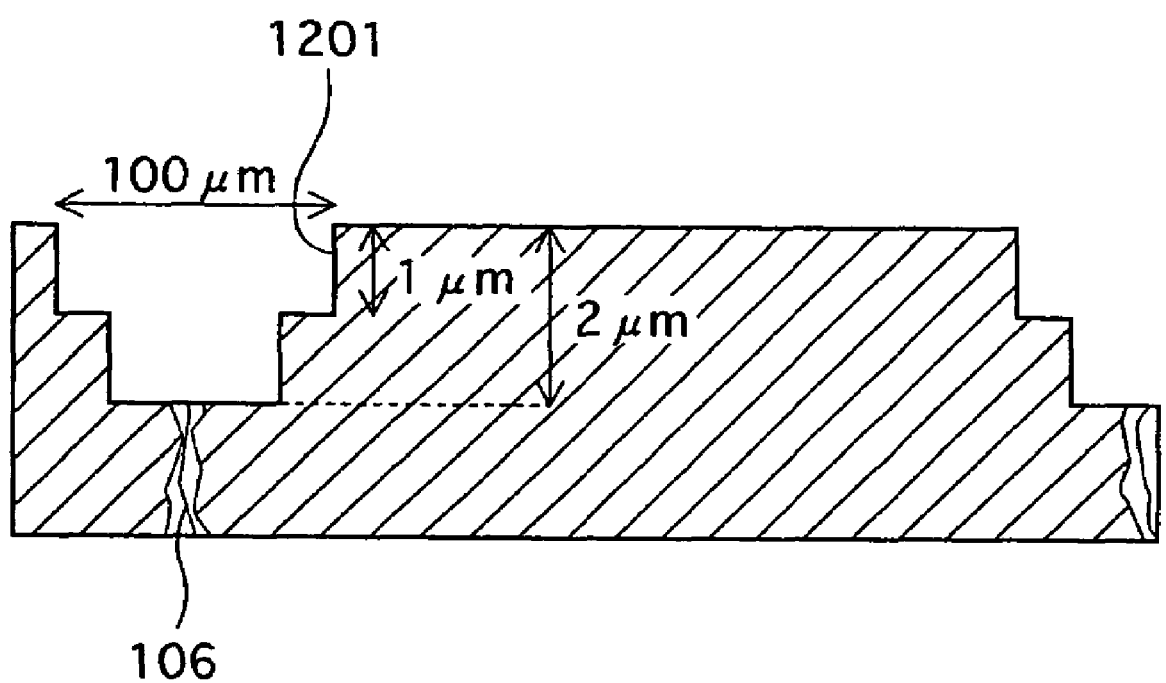
FIG. 14 is a sectional view of a groove according to a modification example (No. 3)

Furthermore, as FIG. 14 shows, a groove section 1201 may be formed as stairs.

Figure 15:
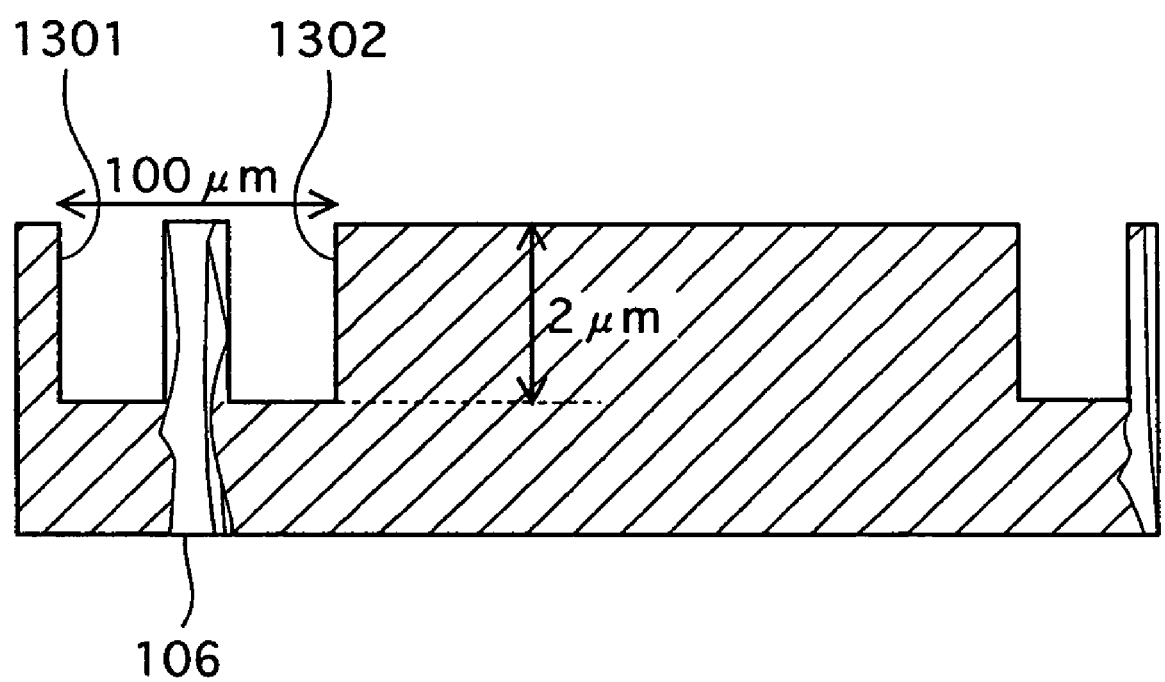
FIG. 15 is a sectional view of a groove according to a modification example (No. 4)

In addition, each groove (108 or the like) described above includes a dislocation concentrated region (106 or the like). Alternatively, however, it is possible to form a pair of grooves 1301 and 1302 (see FIG. 15) respectively at both sides of the dislocation concentrated region 106, without etching the dislocation concentrated region 106.

In addition, although an n-type GaN substrate 102 is used in the above explanation, a p-type GaN substrate may be alternatively adoped, needless to say.

In addition, in the above explanation, a semiconductor laser having a ridge-type waveguide structure is used as one example. However, since the present invention enables each nitride semiconductor layer to have a constant film thickness, application of the present invention to other semiconductor lasers having a different waveguide structure may also produce effects of device characteristic enhancement and product yield improvement. For example, when forming a waveguide using ion implantation, if the film thickness of each semiconductor layer is inconsistent, the depth of ion implantation becomes inconstant with respect to a light emitting layer in the stacking direction, and accordingly, light trapping in the horizontal direction becomes inconsistent, which might adversely affect the device characteristic. On the contrary, the present invention enables a film thickness of each nitride semiconductor layer to be consistent, thereby realizing a constant depth of ion implantation. As a result, the present invention enables light trapping in the horizontal direction to be consistent, and so can achieve device characteristic enhancement and product yield improvement.

In addition, in the case of striped electrode structure in which waveguides are incorporated in the stripe formation of electrodes (i.e. that is not provided with ridge parts unlike the aforesaid ridge-type waveguide structure), if the film thickness of each semiconductor layer is inconsistent, adherence reduction of the electrodes, to be stacked on the semiconductor layer, is feared. Furthermore, in an assembly process for mounting a device having such a striped electrode structure to a substrate such as a submount so that the electrode-provided surface faces the submount (so called "junction-down assembly"), heat-dissipation characteristic deterioration and malfunction in light-emitting position control are feared, if the film thickness of each semiconductor layer is inconsistent. As a result, deterioration in device characteristic and in product yield is accordingly feared. The present embodiment, however, yields a constant film thickness for each nitride semiconductor layer. Therefore such a problem is overcome, and device characteristic enhancement and product yield improvement are pursued.

Note that in the above-described embodiment, crystal growth for each nitride semiconductor layer is conducted using a MOCVD method, however the present invention is not limited to such, and other methods can be used. The other methods for crystal growth include: an HVPE (halide vapor phase epitaxy) method; a gas source MBE (molecular beam epitaxy) method that uses, as material gas, Al, Ga, In, $NH_3$, $SiH_4$, $GeH_4$, and $Mg(C_5H_5)_2$, and the like; and an MBE method that uses Al, Ga, In, $GeH_4$, Mg, and radical nitride or hydrazine.

In addition, in the above-stated embodiment, each nitride semiconductor layer is stacked on a (0001) crystal plane of a GaN substrate. However, the crystal plane to be used may be in other directions. For example, a (H, K, —H–K, 0) crystal plane, such as (1-100) and (11-20) crystal planes, may be used for the stacking. In this case, piezoelectric field will not occur, and so the light emitting layer will have improved light emitting efficiency.

In addition, a nitride semiconductor substrate obtained by cutting a (0001) crystal plane in the range of 1.0° or below may also be used.

Furthermore, in the above-stated embodiment, the light emitting layer is in MQW structure. However, the same effect is obtained if the light emitting layer is in single quantum well structure.

In addition, the present invention, relating to a technology for improving film-thickness consistency, is applicable to light emitting diodes and to light receiving devices, for yielding consistency of a light emitting layer or the like. Furthermore, the present invention is also applicable to active devices such as a FET whose etching/electrode patterns are intricate.

The following shows test data comparing consistency of film thickness between: nitride semiconductor devices according to the present invention; and a conventional example that do not form grooves along the dislocation concentrated regions.

Figure 16:
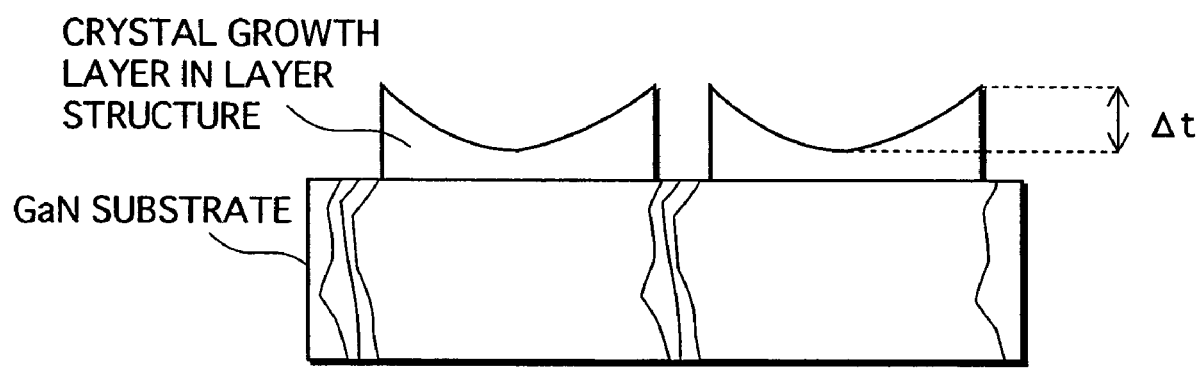
FIG. 16 is a diagram for explaining how to estimate variations in film thickness for a crystal growth layer formed on a GaN substrate.

FIG. 16 shows a method for measuring film thickness used in comparison of consistency of film thickness. Here, a difference between the largest film thickness and smallest film thickness for a crystal growth layer is named Δt.

FIG. 17 shows a comparison example where an average film thickness is set as 3 μm.

This example contains the following cases: a case with no groove such as in a conventional example, and a case with a groove pattern shown in the first embodiment (FIG. 5); and a case with a groove pattern shown in FIG. 11. Firstly in the table, difference in film thickness is shown, and secondly, a value obtained by dividing the film-thickness difference by the average film thickness is shown in percentage representation.

As can be understood by this drawing, if grooves are formed before formation of the nitride-semiconductor crystal growth layer, absorbent is restrained from migrating thereby leading to improvement in film thickness. In particular, if the groove pattern is formed in two directions of an extending direction of the dislocation concentrated regions and an orthogonal direction to the extending direction, consistency in film thickness is perfectly maintained.

Figure 18:
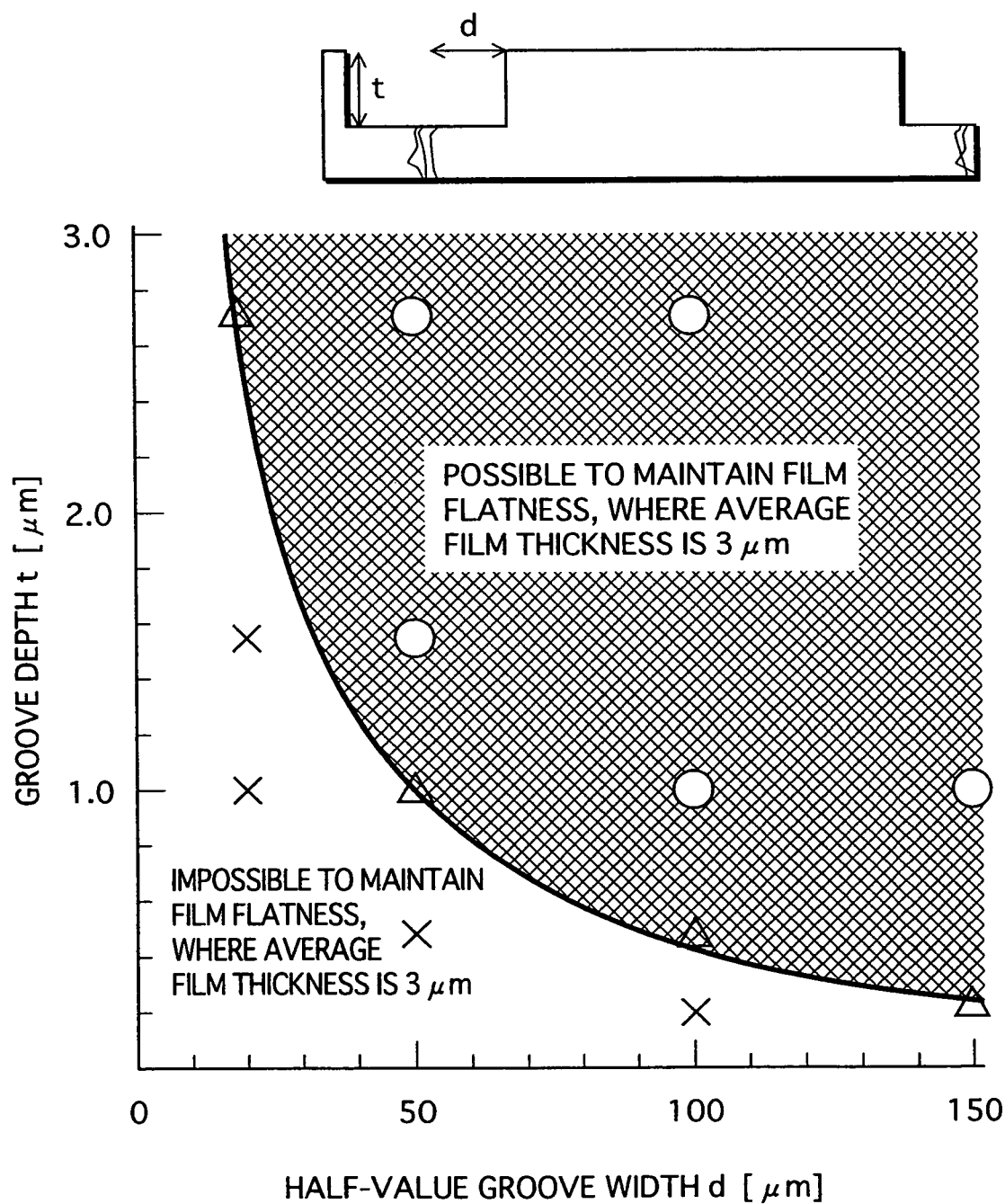
FIG. 18 is a graph showing a relation between depth/width of grooves and film-thickness consistency of a crystal growth layer formed on a GaN substrate, according to the first embodiment.

Next, the graph of FIG. 18 shows a relation between film-thickness consistency and grooves' depth/half width. The horizontal axis represents half width of grooves, and the vertical axis represents depth of grooves (in unit of μm). The average film thickness is 3 μm. In the drawing, the symbol x represents a portion having inconsistent film thickness, the symbol Δ represents a boundary in which consistency in film thickness is maintained, and the symbol ○ represents a portion having desirable film-thickness consistency. The test result shows that consistency in film thickness is maintained in the upper part of the curve (hatch-lined part).

As the half width of grooves becomes large, use efficiency of low dislocation regions will be impaired. As the depth of grooves becomes large, efficiency in etching processing will be worsened.

Accordingly, optimal ranges are as follows: the grooves' depth between 0.7 μm and 2.5 μm; and the grooves' half width between 70 μm and 20 μm.

The nitride semiconductor device and the manufacturing method thereof according to the present invention, as yielding excellent semiconductor laser characteristic and improved product yields, are usable in the field of light source for optical disks of large capacity, and the like.

Although the present invention has been fully described by way of examples with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A manufacturing method of a nitride semiconductor device having a nitride semiconductor substrate in which dislocation concentrated regions align in stripe formation, the dislocation concentrated regions extending from a front surface to a back surface of the substrate, the manufacturing method comprising:
   a stacking step of forming nitride semiconductor layers on the front surface of low dislocation regions of the substrate; and
   a groove-forming step of, prior to the stacking step, performing groove-forming to at least the low dislocation regions of immediate areas of the dislocation concentrated regions on the front surface, wherein
   pair grooves are formed at both sides of the dislocation concentrated regions, without etching the dislocation concentrated regions.

2. The manufacturing method of claim 1, wherein the groove-forming step comprises:
   a mask-forming sub step of forming etching masks on the front surface of the substrate excluding the dislocation concentrated regions as well as the immediate areas;
   an etching substep of subjecting the front surface of the substrate to etching; and
   a mask-removal sub step of removing the etching masks formed in the mask-forming substep.

3. The manufacturing method of claim 2, wherein the etching masks are made of $SiO_2$, and the etching substep is conducted by a reactive ion etching that uses $Cl_2$ gas.

4. The manufacturing method of claim 3, wherein
   a width and a depth of each resulting groove are within such ranges that restrain migration of the nitride semiconductor layers from inside to outside of the groove in the succeeding stacking step.

5. The manufacturing method of claim 2, wherein
   the groove-forming step is performed using anisotropic etching, so that each resulting groove has a substantially rectangular sectional form.

6. The manufacturing method of claim 2, wherein
   a sectional form of each resulting groove is formed as a mesa whose both side walls are inclined towards a corresponding dislocation concentrated region from the front surface of the substrate to a bottom wall of the groove.

7. The manufacturing method of claim 2, wherein
   a sectional form of each resulting groove is formed as a reverse mesa whose both side walls are inclined towards an opposite direction to a corresponding dislocation concentrated region from the front surface of the substrate to a bottom wall of the groove.

8. The manufacturing method of claim 1, further comprising:
   an orthogonal-groove forming step of, in parallel with the groove-forming step, forming grooves orthogonal to grooves resulting from the groove-forming step, on the front surface of the substrate in areas except for the dislocation concentrated regions.

9. The manufacturing method of claim 1, wherein
   the front surface and the back surface of the substrate are (0001) crystal planes.

10. The manufacturing method of claim 1, wherein
    an edge is formed at a boundary between a groove and a surface of the low dislocation region.

11. The manufacturing method of claim 1, wherein
    a groove is in a shape of stairs in a cross section.

* * * * *